United States Patent [19]

Francombe et al.

[11] 4,047,214
[45] Sept. 6, 1977

[54] ELECTROSTATICALLY BONDED DIELECTRIC-ON-SEMICONDUCTOR DEVICE, AND A METHOD OF MAKING THE SAME

[75] Inventors: Maurice H. Francombe; Shu-Yau Wu, both of Pittsburgh, Pa.

[73] Assignee: Westinghouse Electric Corporation, Pittsburgh, Pa.

[21] Appl. No.: 610,364

[22] Filed: Sept. 4, 1975

[51] Int. Cl.² .................... H01L 29/78; H01L 27/12; H01L 29/84; H01L 23/48
[52] U.S. Cl. ............................. 357/23; 357/4; 357/26; 357/68
[58] Field of Search ............................. 357/4, 23, 26

[56] References Cited

U.S. PATENT DOCUMENTS

| | | | |
|---|---|---|---|
| 3,479,572 | 11/1969 | Pokorny | 357/4 |
| 3,585,415 | 6/1971 | Muller et al. | 357/23 |
| 3,686,579 | 8/1972 | Everett | 357/26 |
| 3,851,280 | 11/1974 | Staples | 357/23 |
| 3,868,719 | 2/1975 | Kurtz et al. | 357/26 |

OTHER PUBLICATIONS

IEEE Transactions on Electron Devices, vol. ED-14, No. 12, Dec. 1967 – Perlman et al.

Primary Examiner—Edward J. Wojciechowicz
Attorney, Agent, or Firm—C. L. Menzemer

[57] ABSTRACT

An electrostatically bonded dielectric-on semiconductor device, such as a ferroelectric field-effect transistor or amplifying acoustic surface wave transducer, is made with a dielectric body having properties selected from the group consisting of ferroelectricity and piezoelectricity. The dielectric body has opposed first and second major surfaces, with at least said first major surface of planar configuration to which a semiconductor body is electrostatically bonded. The semiconductor body is of a bulk material and a given conductivity type, and has first and second opposed major surfaces, with at least the first major surface of planar configuration where the semiconductor body is electrostatically bonded. At least one and typically a plurality of electrodes are positioned on the dielectric body to provide for interaction between transport carriers in the semiconductor body and electric polarization changes in the dielectric body. Preferably, the dielectric-on-semiconductor is made by the method described.

7 Claims, 9 Drawing Figures

ELECTROSTATICALLY BONDED DIELECTRIC-ON-SEMICONDUCTOR DEVICE, AND A METHOD OF MAKING THE SAME

FIELD OF THE INVENTION

The present invention relates to semiconductor devices and particularly ferroelectric-on-semiconductor and piezoelectric-on-semiconductor devices.

BACKGROUND OF THE INVENTION

Dielectric-on-semiconductor devices comprise ferroelectric or piezoelectric material laminated to a semiconductor material. The mechanism of these devices involves the interaction between transport carriers in the semiconductor material and polarization changes in the dielectric material induced by electric fields and/or physical stresses. Illustrative of such devices are ferroelectric field-effect transistors and amplifying acoustic surface wave transducers. See, e.g., U.S. Pat. Nos. 2,791,758, 2,791,759, 2,791,760, 2,791,761 and 3,832,700; Yamanishi, Kawamura and Nakayama, Appl. Phys. Lett. 21, 146 (1972); Collins, Lakin, Quate and Shaw, Appl. Phys. Lett. 13, 314 (1968); Lakin, Collins and Hogan, Proc. IEEE (Letters) 57, 740 (1949); and U.S. Pat. No. 3,828,283.

Ferroelectric field-effect transistors were previously made by laminating a bulk ferroelectric crystal to a separately made single-crystal semiconductor wafer. The ferroelectric material was a crystal of guanidinium aluminum sulfate hexahydrate (GASH), and the semiconductor material was a crystal of germanium. The air gap between the two materials was minimized by carefully lapping, polishing and cleaning the surfaces of the crystals in very flat, planar configurations, and in some devices, by filling the remaining air gap with a dielectric material such as ethylene cyanide or nitrobenzene. These devices were not, however, commercially successful. Poor efficiency was encountered in modulating the conductivity of the semiconductor surface with electrostatic charges induced by polarization of the ferroelectric material.

Ferroelectric field-effect transistors have also been made by deposition of polycrystalline or amorphous semiconductor material on a single-crystal or polycrystalline ferroelectric substrate. Specifically, a thin film of tellurium, cadmium sulfide or tin-doped indium oxide was vacuum evaporated on single-crystal triglycine sulfate (TGS) and barium titanate ($BaTiO_3$) substrates, and on polycrystalline lead zirconate titanate (PZT) substrates. These transistors have not, however, been satisfactory because of the poor electrical instability of the semiconductor films. Specifically, the transconductance was low, and the gate threshold or gate turn-on and cut-off voltages would drift and decay the order of volts during operating periods of a few hours to a few days.

Ferroelectric field-effect transistors have also been made by deposition of a ferroelectric material on a bulk semiconductor crystal. See United States patent application Ser. No. 354,022, filed Apr. 24, 1973 by one of the coapplicants hereof, assigned to the same assignee as the present application. Specifically, a thin film of bismuth titanate ($Bi_4Ti_3O_{12}$) was deposited on a single-crystal silicon wafer by sputtering, vacuum evaporation, chemical vaporization, or spinning deposition techniques. This structure has certain advantages as described in the identified copending application, e.g., high transconductance and electrical stability in the ON and the OFF states. However, this structure was limited in modulation efficiency by reason of the properties of the ferroelectric film, which are inferior to the properties of corresponding bulk ferroelectric materials.

Similarly, amplifying surface wave transducers have been made previously by deposition of a thin film of piezoelectric material on a semiconductor substrate. The piezoelectric material is typically a polycrystalline zinc oxide, zinc sulfide or cadmium sulfide, and the semiconductor material is a single-crystal silicon. Interdigitated grid electrodes are positioned at opposite ends of the piezoelectric film to transmit and receive acoustic surface waves along the surface of the piezoelectric film, and localized high concentration impurity is provided in the semiconductor substrate adjoining the piezoelectric film at the interdigitated electrodes. A plane of conductivity is thus formed in the semiconductor at the piezoelectric film when an electric signal is applied to the electrode, which increases the capacitance and normal electric field component of the transducer, and in turn, amplifies the acoustic surface wave propagated and received. Such amplifying surface wave transducers are, however, limited by the properties of the piezoelectric thin film, which are generally inferior to the bulk counterparts.

The present invention overcomes these difficulties and disadvantages, and provides a dielectric-on-semiconductor device with increased modulation efficiency and a higher coupling constant than corresponding prior art devices. Further, it provides dielectric-on-semiconductor devices possessing the characteristics of both bulk semiconductor material and bulk ferroelectric or piezoelectric material.

SUMMARY OF THE INVENTION

An electrostatically bonded dielectric-on-semiconductor device is provided utilizing a dielectric body with ferroelectric or piezoelectric properties. The device exhibits increased efficiency of modulation of transport carriers in a semiconductor body having bulk semiconductor properties, by electric polarization of the dielectric body induced by electric fields, or by physical forces, and vice versa. Crystal dislocations and surface states at and adjacent their interface between the dielectric body and the semiconductor body are substantially reduced in the devices from the above-described prior art devices.

The dielectric-on-semiconductor device is made from a dielectric body with properties selected from the group consisting of ferroelectricity and piezoelectricity. The dielectric body has first and second opposed major surfaces with at least said first major surface of planar configuration. The dielectric body is preferably a bulk material for certain devices, and is preferably a composite material for certain devices as hereinafter described. The dielectric body is by its properties single-crystal or polycrystalline (ceramic), although where the body is a composite structure the supporting part may be an amorphous material. The major surfaces of the body may be arranged in any desired crystallographic orientation, which may substantially reduce the procedure to fabricate the device.

A semiconductor body of a bulk material and given conductivity type (i.e. N or P type), typically of silicon or germanium, is formed preferably in single-crystal or polycrystalline form. The semiconductor body is prepared with first and second opposed major surfaces and at least first major surface in a planar configuration. The semiconductor body is then electrostatically bonded to the dielectric body with said first major surfaces in intimate contact, forming an electrostatic bond layer therebetween. Preferably, prior to bonding, a metal layer is applied to the second major surface of the dielectric body so that a more rapid and uniform electrostatic bond layer can be formed by providing more uniform electric potential across the dielectric body. After electrostatic bonding, the metal layer is generally removed to avoid disturbance with other parts of the device during the remaining fabrication and operation. After electrostatic bonding, either the dielectric body or the semiconductor body has the portions adjoining the second major surface thinned to a few microns, typically less than about 50 microns, to provide for device operation.

Thereafter, at least one and typically a plurality of electrodes are positioned on the dielectric body to provide for interaction between transport carriers in the semiconductor body and electric polarization changes in the dielectric body. The number and positioning of the electrodes will depend on the specific device desired. For a ferroelectric field-effect transistor, source and drain electrodes are ohmically connected to the semiconductor body at the first major surface thereof, spaced apart from each other to form a transistor channel therebetween. Source and drain impurity regions of opposite conductivity type from the semiconductor body are preferably formed in the semiconductor body, which has a resistivity preferably between 0.01 and 150 ohm-cm, at the source and drain electrodes typically by diffusion. Also positioned between the source and drain electrodes is the dielectric body selected with ferroelectric properties, with a gate electrode positioned thereon to polarize the ferroelectric material.

For an amplifying acoustic wave transducer, the dielectric body is selected with piezoelectric properties, and grid electrodes having interdigitated fingers typically with alternate fingers attached to the same contact of the electrode are positioned on either the first or second major surface of the dielectric body. The electrodes are adapted to receive an electrical signal and propagate acoustic surface waves along said surface of the dielectric body responsive to the electrical signals and to receive said propagated acoustic surface waves along said surface of the dielectric body and produce an electrical output signal responsive to said acoustic surface wave.

Where the grid electrodes are positioned on the second major surface of the dielectric body, the dielectric body in preferably between about 1 to 50 microns in thickness, and the resistivity of the semiconductor body at least in the regions adjoining the first major surface underlying said first and second electrodes, which are on the second major surface of the dielectric body, is less than 1.0 ohm-cm and preferably between 0.05 and 0.001 ohm-cm to provide at least a plane of conductivity underlying said electrodes.

Where the grid electrodes are positioned on the first major surface of the dielectric body, the grid electrodes are positioned at opposite end portions of the dielectric body with the semiconductor body electrostatically bonded to said first major surface at least between said electrodes. The semiconductor body is in this instance between about 1 and 50 microns in thickness, with the dielectric body being the supporting member for the structure. In one embodiment, two field electrodes are positioned on the second major surface of the semiconductor body substantially parallel to each other along and astride the direction of travel of acoustic surface waves between the grid electrodes. In another embodiment, a gate electrode is positioned on the second major surface of the semiconductor body between the grid electrodes astride the direction of travel of acoustic surface waves between the electrodes to form an acoustic surface wave convolver.

Other details, objects and advantages of the invention will become apparent as the following description of the present preferred embodiments thereof and the presently preferred methods of making and practicing the same proceeds.

BRIEF DESCRIPTION OF THE DRAWINGS

In the accompanying drawings, the presently preferred embodiments of the invention and the presently preferred methods of making the same are shown, in which.

DESCRIPTION OF THE PREFERRED EMBODIMENTS

Figure 1:
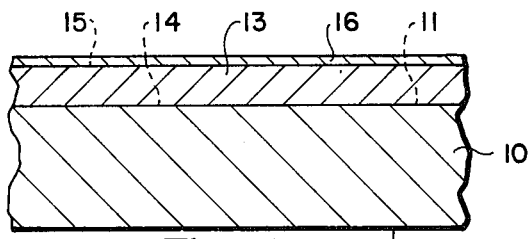
FIGS. 1 and 3 are cross-sectional views in elevation of a ferroelectric field-effect transistor of the present invention at various stages in its manufacture.
Figure 2:
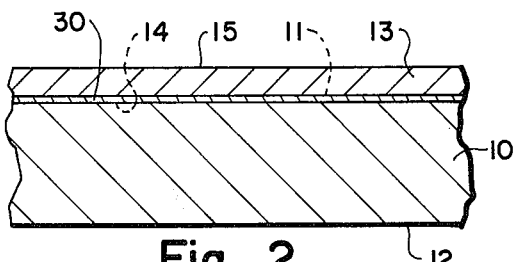

Referring to FIGS. 1-4, an electrostatically bonded dielectric (ferroelectric)-on-semiconductor device and particularly a ferroelectric field-effect transistor is made by first forming a semiconductor body 10 having opposed first and second major surfaces 11 and 12 of a given conductivity (i.e. N or P type). Semiconductor body 10 is a bulk material made by any conventional available method. By "bulk material" is meant material separately made in any way other than epitaxy or another vapor or sputter deposition method.

Typically, semiconductor body 10 is a silicon wafer made by Czochralski or float-zone techniques. Alternatively, semiconductor body 10 may be a single crystal germainum or gallium arsenide. Also, although not desirable for field-effect transistors, semiconductor body 10 may be a single crystal, polycrystalline or amorphous material of any other suitable Group IV, III–V or II–VII semiconductor material, depending upon the device being fabricated. The semiconductor body may be prepared with major surfaces 11 and 12 in any convenient crystallographic orientation, subject on the requirements of the device being fabricated. The impurity concentration of the semiconductor body 10 will, of course, vary with the particular electrical characteristics desired in the finished device; however, in any case, the resistivity (N or P type) is preferably between about 0.01 and 150 ohm-cm.

Semiconductor body 10 is typically in a circular shape and has a substantially uniform thickness typically of between 20 and 100 microns. The semiconductor body is prepared by carefully lapping, polishing and cleaning major surfaces 11 and 12, with first major surface 11 in a planar, flat configuration. These lapping, polishing and cleaning procedures are standard techniques. They are believed important to provide a good, intimate contact between semiconductor body 10 and a ferroelectric body, and a good electrostatic bond therebetween as hereinafter described.

Dielectric body 13 is preferably a bulk material with ferroelectric properties, and preferably bismuth titanate ($Bi_4Ti_3O_{12}$), triglycine sulfate (TGS), barium titanate ($BaTiO_3$), lead zirconate titanate (PZT), or guanidinium aluminum sulfate hexahydrate (GASH). A "ferroelectric" material is in this respect a substance that exhibits spontaneous polarization and hysteresis, i.e., the electric analog of ferromagnetic material. The dielectric body is by its nature in a single crystal or polycrystalline (ceramic) form. Dielectric body 13 has a substantially uniform thickness typically of between 1 and 10 microns.

Dielectric body 13 is prepared by carefully lapping, polishing and cleaning first and second major surfaces 14 and 15, with first major surface 14 in a flat, planar configuration. Major surfaces 14 and 15 may be provided in any crystallographic orientation depending on the particular device being fabricated. Although crystallographic orientation may be important to the operation of the particular device, the lattice orientation of the dielectric body is not generally important to the strength of the electrostatic bond to be formed to semiconductor body 10. Such lapping, polishing and cleaning procedures are standard techniques, and are believed important to provide good, intimate contact between the dielectric body and the semiconductor body, and good electrostatic bond between them.

Preferably, dielectric body 13 is also prepared for electrostatic bonding by applying a metal layer 16 to second major surface 15. Metal layer 16 is a metal, such as gold, deposited preferably by one of the standard vapor or sputter deposition techniques typically over the entire second major surface 15 to a thickness of about 5,000 to 10,000 Angstroms. Metal layer 16 provides a uniform field distribution across the dielectric body during the electrostatic bonding step hereinafter described.

Figure 9:
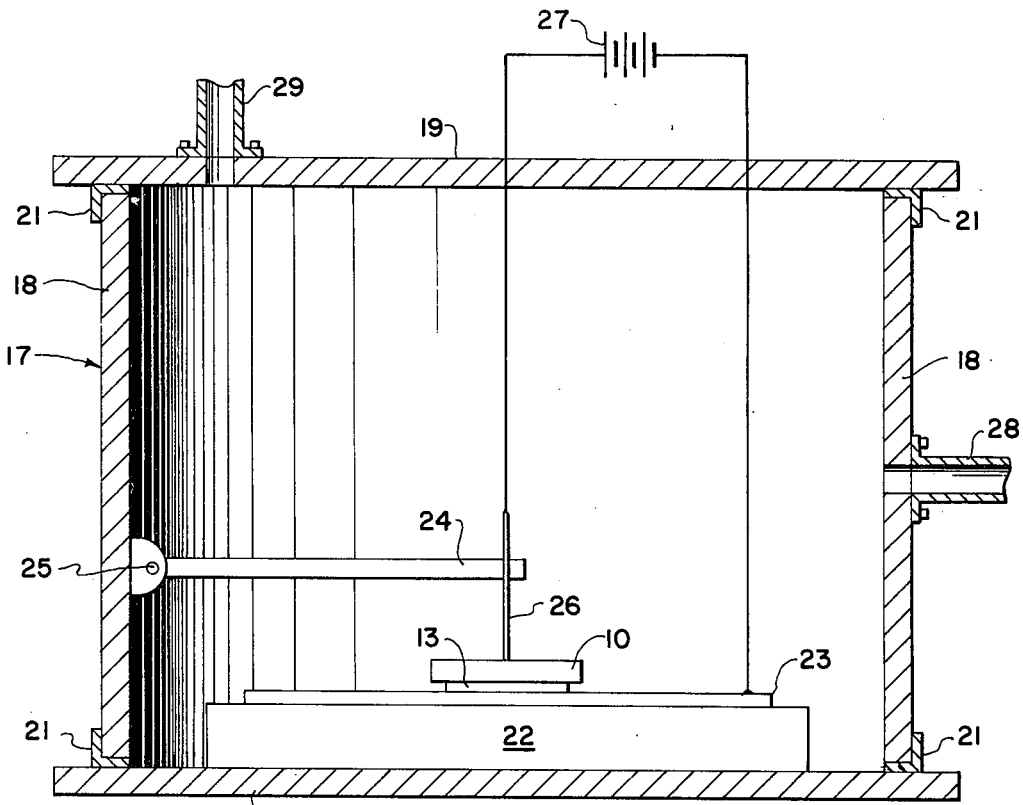
FIG. 9 is a schematic view in elevation of apparatus suitable for performing the electrostatic bonding step of the present invention.

Dielectric body 13 and semiconductor body 10 are prepared for electrostatic bonding by first placing major surface 11 of the semiconductor body and first major surface 14 of the dielectric body in intimate contact in the apparatus shown in FIG. 9. That apparatus comprises furnace chamber 17 in which a suitable atmosphere or vacuum is established to avoid oxidation. Furnace chamber 17 is comprised of cylindrical sidewalls 18 and circular end caps 19 and 20. The sidewalls and end caps are heat conductive or heat insulating depending on whether the heat source for the furnace is within or without the furnace chamber. Preferably, the heat source is an RF induction heater (not shown) extending cylindrically around the outside of sidewalls 18, which are of a heat conductive material such as quartz. Cylindrical sidewalls 18 are hermetically sealed to end caps 19 and 20 by standard L-shaped seals 21 to provide for ease in disassembly of furnace 17 for disposition and removal of apparatus to and from the furnace chamber.

Semiconductor body 10 and dielectric body 13 are laid in chamber 17 on holder 22 and planar, conductive strip 23 (such as platinum) with their first major surfaces 11 and 14 together and with metal layer 16 in contact with conductive strip 23 over its entire surface. Manipulator arm 24 is then pivoted at 25 to bring light pressure, preferably platinum contact 26 into place in contact with semiconductor body 10 preferably at the central portion of the semiconductor body. Pressure contact 26 is electrically connected to one terminal of DC power supply 27 and conductive strip 23 is electrically connected to the other terminal of DC power supply 27.

A suitable atmosphere is then established in the furnace chamber 17 preferably by exhaustion through outlet port 28, which preferably communicates with a standard oil diffusion, vacuum pump (not shown). Preferably, the atmosphere is provided of a partial vacuum of typically less than $1 \times 10^{-5}$ torr and most desirably less than $1 \times 10^{-7}$ torr, or of relatively inert gases such as nitrogen or argon. Inert gas may be input to the chamber through inlet port 29. Ambient air may also be used to provide the desired atmosphere, where procedures are followed as hereinafter described, to avoid oxidation at first major surfaces 11 and 14.

The assembly is then heated in furnace 17 typically by an RF induction heater (not shown) around sidewalls 18 of furnace 17. If the atmosphere in the furnace is ambient air, a potential of at least about 300 volts and typically about 500 volts is applied across body 10 and dielectric body 13 between conductive strip 23 and pressure contact 26 before heating to avoid oxidation. Where the atmosphere is a vacuum or inert atmosphere, the nature of the atmosphere itself is sufficient to avoid oxidation of semiconductor body 10. The assembly is heated to at least 300° C. and preferably at least 450° C. The precise temperature will depend on the composition of the dielectric body. For example, 300° to 400° C. is sufficient if the dielectric body is zirconate titanate (PZT). For bismuth titanate ($Bi_4Ti_3O_{12}$) or barium titanate ($BaTiO_3$), the furnace is heated to a minimum of 400° C. and most desirably 600° to 700° C. The temperature must, however, be below the softening or melting point of both the ferroelectric and semiconductor bodies. For this reason, the temperature is generally not above 900° C., depending on the ferroelectric and semiconductor material.

An electrical potential of at least 700 volts and typically 1500 to 2000 volts, is then applied across dielectric body 13 and semiconductor body 10 between conductive strip 23 and pressure contact 26. The electric potential will vary with the composition of the dielectric semiconductor bodies, their thicknesses, and the temperature to which the assembly is heated. The voltage must be sufficient at the particular heat to cause a small current of at least 0.1 to 20 milliamperes/m² and preferably 1 to 10 milliamperes/m² to pass through the dielectric and semiconductor bodies.

When the assembly is heated and the electric potential applied across the dielectric and semiconductor bodies, electrostatic bond layer 30 is progressively formed at the interface between dielectric body 13 and semiconductor body 10. It is believed that as current flows through relatively small spaced apart areas of first major surfaces of the dielectric body and semiconductor body, which are in actual physical contact, adjacent surface areas become depleted of charge and electrostatic attraction occurs between adjacent portions of major surfaces 11 and 14 of semiconductor body 10 and dielectric body 13. The adjacent portions of the first major surfaces are thus drawn together forming bond layer 30 of increased resistivity. The current flow is in turn diverted to adjacent areas of lower resistivity, and bond layer 30 is progressively formed. The electrostatic bonding continues uniformly throughout the interface by reason of the presence of metal layer 16 which distributes the electrostatic field substantially uniformly over the dielectric body. Because of the minute thickness of bond layer 30, it has not been possible to determine with certainty its chemical or physical composition.

Time required to form bond layer 30 will vary primarily with the current flow through the interface, with the higher current flow associated with the shorter bonding time. The time, therefore, varies with the ferroelectric and semiconductor materials being bonded, the thicknesses of those materials, and the temperature to which the materials are heated. Generally, electrostatic bond layer 30 will, however, be fully formed in a time period of 30 seconds to 30 minutes irrespective of the parameters, unless a very low potential or temperature is utilized. In these latter circumstances, the formation of bond layer 30 may require several hours.

After formation of electrostatic bond layer 30, the assembly is cooled to below about 300° C. at a low cooling rate to avoid cracking of bodies 10 an 13 and the electrostatic bond layer 30. The precise cooling rate depends primarily upon the difference in the coefficient of thermal expansion of the ferroelectric and semiconductor materials, and thickness of the semiconductor body and dielectric body. For bismuth titanate ($Bi_3Ti_4O_{12}$) and silicon of less than 50 microns in thickness, the cooling rate is typically of about 5° to 10° C. per minute.

After cooling, the electrostatic bonded ferroelectric-on-semiconductor assembly is removed from furnace 17, and dielectric body 13 thinned to a substantial uniform thickness of about 1 to 5 microns by removing portions of the dielectric body adjacent second major surface 15. The removal of the portion of the dielectric body 13 adjacent second major surface 15 may be accomplished by any of the available techniques such as chemical etching, anodic dissolution or ion beam milling. Before, after and during the thinning of the dielectric body 13, metal layer 16 is preferably removed from second major surface 15 of dielectric body so that further device fabrication steps can proceed.

Figure 3:
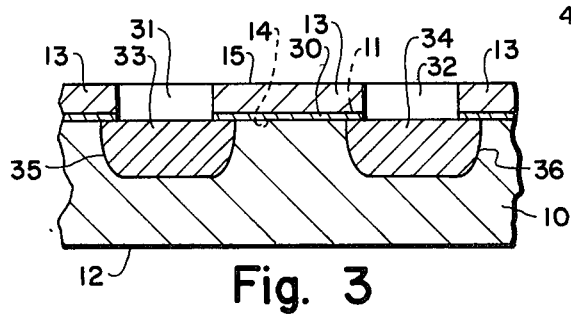

Referring to FIG. 3, window patterns 31 and 32 are opened in dielectric body 13 so that access to the source and drain impurity regions 33 and 34, respectively, can be had.

Impurity regions 33 and 34 of opposite conductivity to semiconductor body 10 and in spaced relation to each other are preferably diffused by standard open or closed tube diffusion techniques into semiconductor body 10 before the semiconductor and dielectric bodies are bonded together. Preferably, if the semiconductor is silicon, the diffusion is performed by open tube diffusion through windows in a silicon dioxide ($SiO_2$) masking layer, where the impurity is introduced as a gas such as arsine ($AsH_3$), phosphine ($PH_3$) or diborane ($B_2H_6$) in a suitable carrier gas. Source and drain impurity regions 33 and 34 form PN junctions 35 and 36, respectively, with the residual impurity concentration of semiconductor body 10. Impurity regions 33 and 34 are preferably diffused with a surface impurity concentration between about $1 \times 10^{19}$ and $1 \times 10^{21}$ atoms/cm$^3$ and a depth of about 1 to 3 microns.

After diffusion is completed, the silicon dioxide or other diffusion masking layer is removed. The silicon semiconductor body is then electrostatically bonded to the dielectric body and window patterns 31 and 32 are opened in dielectric body 13 as above described.

Figure 4:
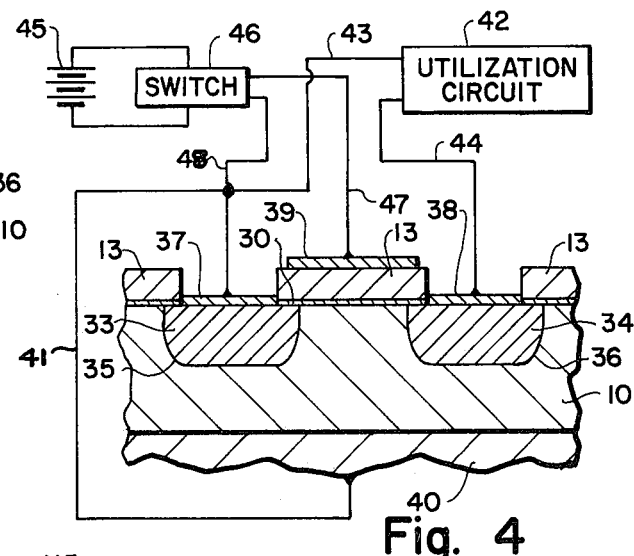
FIG. 4 is a cross-sectional view in elevation of a ferroelectric field-effect transistor made in accordance with FIGS. 1 through 3 and adapted for use in a memory circuit.

Referring to FIG. 4, source, drain and gate electrodes 37, 38 and 39, respectively, are simultaneously formed to complete a ferroelectric field-effect transistor. Preferably, the electrodes are formed by metallizing the exposed surfaces of the dielectric body and the semiconductor body at window patterns 31 and 32 by vapor or sputter deposition, and thereafter selectively removing metal by standard photolithographic and etching techniques to form source and drain electrodes 37 and 38 spaced apart from each other in ohmic contact with source and drain impurity regions 33 and 34, respectively, and with gate electrode 39 spaced between source and drain electrodes 37 and 38 on dielectric body 13. Illustrative of suitable metals for these electrodes are gold, nickel, silver, tin, indium, aluminum, palladium, titanium, copper and platinum, and base metals thereof.

The metal is selected for the particular semiconductor material to provide a low resistance, ohmic contact with the semiconductor body 10 at impurity regions 33 and 34. For example, it is preferred to use a gold or aluminum where the semiconductor body 10 is silicon. The thickness to which the electrodes are deposited is dependent upon the desired current density of the transistor. The thickness of the electrodes will typically range from a low of about 80 Angstroms to over 10,000 Angstroms, with between 1,500 and 5,000 Angstroms being generally used.

To provide for use of the ferroelectric fieldeffect transistor in the memory circuit as shown in FIG. 4, the assembly is disposed with second major surface 12 of semiconductor body in contact with the planar surface of electrode 40, typically of antimony doped gold. Electrode 40 is typically separately formed in a circular shape at least as large as semiconductor body 10. Electrode 40 is alloyed to second major surface 12 by heating electrde 40 in intimate contact with second major surface 12 of semiconductor body 10 in an inert atmosphere to a temperature typically of about 420° C. In this way, electrode 40 makes ohmic contact with semiconductor body 10 across the entire major surface 12.

To form the memory circuit, source electrode 37 is electrically connected by lead 41 to electrode 40 at the opposite second major surface 12 of semiconductor body 10. And source and drain electrodes 37 and 38 are electrically connected to utilization circuit 42 via electric leads 43 and 44, with the ferroelectric acting as a switch. Switching of the ferroelectric is controlled by applying a positive or negative voltage from battery 45 through reversing switch circuit 46 and lead 47 to gate electrode 39 and through reversing switch circuit 46 and lead 48 to source electrode 37 and electrode 40.

The operation of the ferroelectric field-effect transistor in the memory circuit is fully described by reference to U.S. Pat. No. 3,832,700, granted Aug. 27, 1974, and assigned to the same assignee as the present application, and need not be restated here. Suffice it to say, the device utilizes the remanent polarization of the ferroelectric to attract or store a positive or negative charge (corresponding to information 1 or 0 in a binary system) in the absence of continuing power on the circuit. The stored information can be readout nondestructively through the channel of the field-effect transistor.

Figure 5:
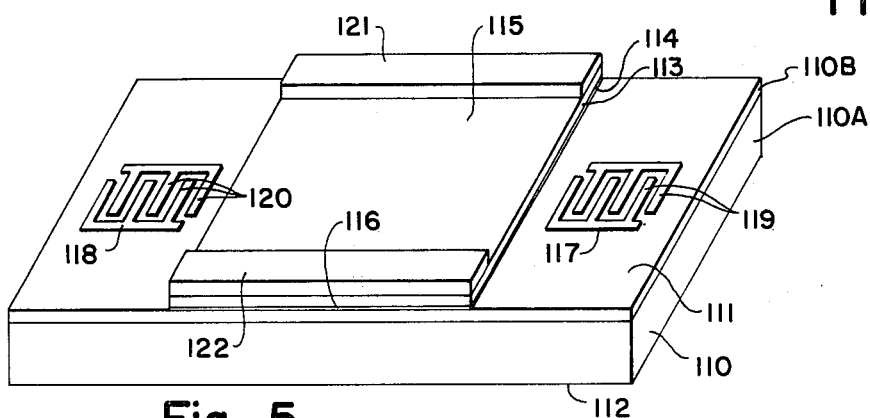
FIG. 5 is a perspective view in elevation of an amplifying acoustic surface wave transducer of the present invention.

Referring to FIG. 5, an amplifying surface wave transducer of the present invention is shown. Dielectric body 110, with first and second opposed major surfaces 111 and 112, is the supporting part of the transducer. Body 110 is selected with piezoelectric properties in the operation of the transducer. A "piezoelectric" material in this respect is a substance that exhibits electric polarization when a mechanical force is applied to the substance.

Dielectric body 110 may be a bulk material, such as quartz or lithium niobate (LiNbO$_3$), made by any suitable technique preferably to a substantially uniform thickness typically between 10 and 100 mils. Alternatively, body 110 may be a composite of supporting quartz, glass, spinel (i.e. MgO $x$ (Al$_2$O$_3$) where typically $1.05 \leq \chi \leq 3.5$) or sapphire (Al$_2$O$_3$) of 10 to 100 mils in thickness with vapor or sputter deposited lithium niobate (LiNbO$_3$), bismuth germanate (Bi$_{12}$GeO$_{20}$), silicon dioxide (SiO$_2$), gallium arsenide (GaAs), zinc oxide (ZnO), zinc sulfide (ZnS), cadmium sulfide (CdS) or lead zirconate titanate (PZT) at first major surface 111 of 0.5 to 50 microns in thickness. The thickness of the latter depends upon the wavelength of the control signal to be transmitted — the thickness being generally about 2 wavelengths of the surface wave to be transmitted. Dielectric body 110 is by its nature in a single crystal or polycrystalline (ceramic) form.

Dielectric body 110 is prepared by carefully lapping, polishing and cleaning first and second major surfaces 111 and 112, with first major surface 111 in a flat, planar configuration. Major surface 111 must be of a preferred crystallographic orientation for the propagation of acoustic surface waves thereon. The lapping, polishing and cleaning procedures are, however, standard procedures, important to provide good, intimate contact between the dielectric body and the semiconductor body and a good electrostatic bond between them.

Semiconductor body 113 is a bulk material made by any conventional method. Typically, semiconductor body 113 is a silicon wafer made by Czochralski or float-zone techniques. Alternatively, semiconductor body 113 may be a single crystal germanium or gallium arsenide. Also, although not preferred, semiconductor body 113 may be a single crystal, polycrystalline or amorphous material of other suitable Group IV, III-V or II-VII semiconductor materials, depending upon the device being fabricated. The impurity concentration of semiconductor body 113 will vary with the particular electrical characteristics desired in the finished device; however, in any case, resistivity (N or P type) is preferably between 0.1 and 100 ohm-cm.

Semiconductor body 113 is typically in a rectangular shape and has a substantially uniform thickness typically between 20 and 50 microns. Semiconductor body 113 is prepared by carefully lapping, polishing and cleaning major surfaces 114 and 115, with first major surface 114 in a planar, flat configuration. These lapping, polishing and cleaning procedures are standard techniques, but are important to provide a good, intimate contact between semiconductor body 113 and dielectric body 110 and in turn a good electrostatic body therebetween.

Dielectric body 110 and semiconductor body 113 are prepared for and electrostatically bonded by the same procedures as above described in connection with FIGS. 1 through 4. First major surface 114 of semiconductor body 113 is electrostatically bonded to central portions of first major surface 111 of dielectric body 110 as shown in FIG. 5. Portions of first major surface 111 of dielectric body 110 are thus left exposed at opposite ends of semiconductor body 113, and bond layer 116 is formed by the electrostatic bond between the semiconductor body and the dielectric body.

Thereafter semiconductor body 113 is thinned to a substantially uniform thickness of about 1 to 20 microns by removing portions of the semiconductor body adjacent second major surface 115. The removal of the portion of the semiconductor body 113 adjacent second major surface 115 may be accomplished by any suitable technique, for example, chemical etching, anodic dissolution or ion beam milling may be used.

Transmitter and receiver grid electrodes 117 and 118 are then positioned on first major surface 111 of dielectric body 110 at opposite ends of semiconductor body 113 to provide transmission and reception of acoustic surface waves through the transducer. Preferably, electrodes 117 and 118 are simultaneously deposited by vapor or sputter deposition of a metal, such as gold or aluminum, through a standard photoresist mask or a metallic mask. Electrodes 117 and 118 each have interdigitated fingers 119 and 120, respectively, with alternate fingers attached to separate contacts of the grid electrode.

The width and spacing of each of the interdigitated fingers 119 and 120 of grid electrodes 117 and 118, respectively, are highly critical. Fingers 119 and 120 of a given width and spacing will transmit or receive only signals in a very select frequency range, rejecting all others. Thus, the fingers of each grid electrode are of substantially equal width and substantially equally spaced and are parallel to each other. Depending on the frequency range of the surface waves to be transmitted and received, the center-to-center spacing of the fingers 119 and 120 is typically between 0.25 and 25 microns, with the width and spacing of the fingers being equal. That is, both the width and the spacing between the fingers are between about 0.12 and 0.25 micron.

Also, the distance between the grid electrode 117 and 118 is critical. Most desirably, the grid electrodes are spaced sufficiently apart to provide for electrostatic bonding of semiconductor body 113 to dielectric body 110, yet not further apart to avoid unnecessary attenuation and power loss of the acoustic surface wave. Typically, the grid electrodes will be about 2 to 10 millimeters apart.

Field electrodes are also positioned substantially parallel to each other on the opposite edges of the semiconductor body 113 along and astride the path of travel of acoustic surface waves between grid electrodes 117 and 118. Preferably, field electrodes 121 and 122 are formed by vapor or sputter deposition through a photoresist mask or metallic mask simultaneously with the formation of grid electrodes 117 and 118. Electrodes 121 and 122 are preferably of gold and aluminum of a thickness ranging from a low of about 80 Angstroms to over 10,000 Angstroms, with between 1,500 and 5,000 Angstroms being typically used.

The resulting amplifying surface wave transducer is operated by applying an electric field between the field electrodes 121 and 122. An electrical signal is thereafter input to transmitter grid electrode 117, where the electrical signal is transduced to an acoustic surface wave which is propagated along the surface 111 of dielectric body 110 to receiver grid electrode 118. During the progagation along surface 111 the surface wave is amplified by the interaction between the field potential through semiconductor body 113 and the transport carriers thereof, and the electrical polarization changes in the dielectric body 110. The surface wave as received at receiver grid electrode 118 is thus amplified from the surface wave transmitted by transmitter grid electrode 117. Receiver grid electrode 118 thus transduces and outputs a corresponding electrical signal which is not attenuated and indeed is amplified over the electrical signal input to transmitter grid electrode 117.

Figure 6:
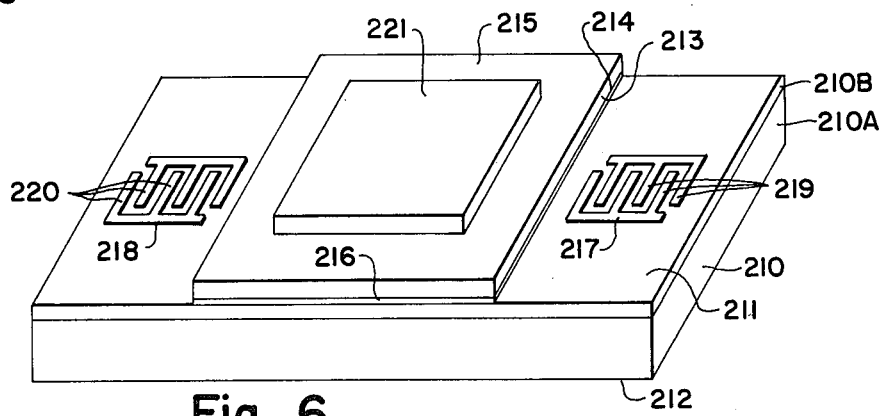
FIG. 6 is a perspective view in elevation of an acoustic surface wave convolver of the present invention.

Referring to FIG. 6, an acoustic surface wave convolver is made pursuant to the present invention. The convolver is made precisely the same as above described in connection with FIG. 5, except that the field electrode 121 and 122 are replaced with a large rectangular gate electrode 221 positioned centrally on semiconductor body 213 astride the direction of travel of surface waves between grid electrodes 217 and 218. A high impurity region may be provided adjoining second major surface 215 to provide low resistance ohmic contact to semiconductor body 213. Accordingly, the parts and elements are correspondingly numbered to the parts and elements of the amplifying surface wave transducer described in connection with FIG. 5, with the prefix 2 instead of 1 in front of each number.

For convolver operation, identical input signals are applied to both the transmitter and receiver grid electrodes 217 and 218, and acoustic surface waves generated at both electrodes. The electrical signal is output from gate electrode 211 on the semiconductor body. A full description of the operation of the acoustic surface wave convolver is given by reference to M. Yamanishi, T. Kawamura and Y. Nakayama, "Acoustic-Surface-Wave-Convolver Using Non-Linear Interaction In A Coupled PZT-Ni System", Appl. Phys. Lett. 21, 146 (1972).

Figure 7:
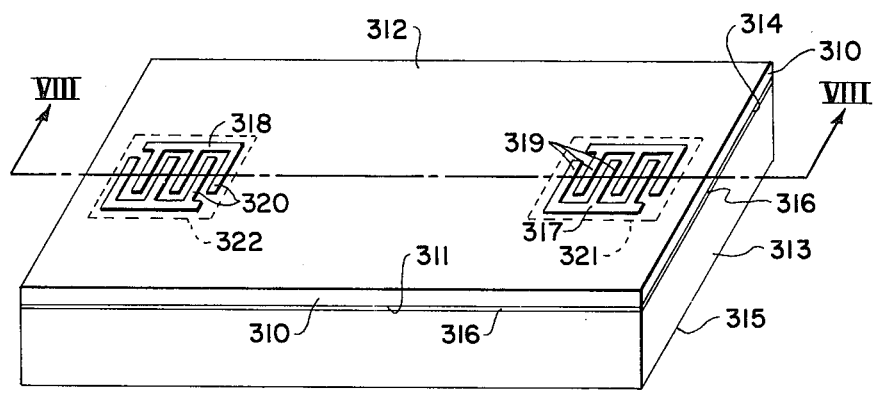
FIG. 7 is a perspective view in elevation of another amplifying acoustic surface wave transducer of the present invention.
Figure 8:
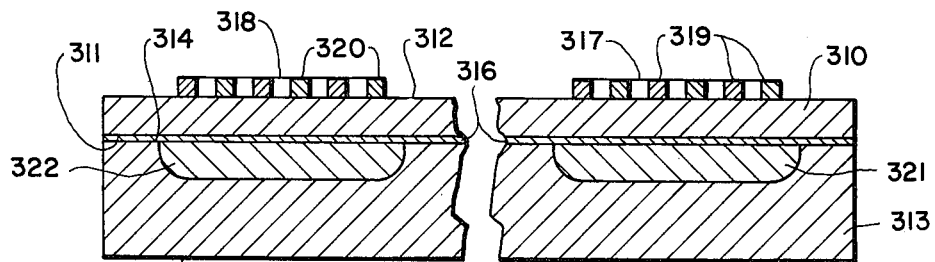
FIG. 8 is a cross-sectional view taking along line VIII—VIII of FIG. 7.

Referring to FIGS. 7 and 8, another amplifying surface wave transducer is shown. This surface wave transducer is made similarly to the transducer described in connection with FIG. 5 with the following exceptions: (i) semiconductor body 313 is typically silicon of a thickness between 5 and 15 mils and the supporting element of the assembly, (ii) that the dielectric body 310 is typically a piezoelectric crystal such as lithium niobate ($LiNbO_3$), silicon dioxide ($SiO_2$) or bismuth germanate ($Bi_{12}GeO_{20}$) which, after electrostatic bonding and appropriate thinning, is of a thickness between 1 and 5 microns, (iii) grid electrodes 317 and 318 are positioned on the second major surface 312 opposite from semiconductor body 313, (iv) no electrodes are provided corresponding to field electrodes 121 and 122, and (v) impurity regions 321 and 322 are provided in semiconductor body 313 adjoining first major surface 314 underlying grid electrodes 317 and 318. For clarity, the parts and elements are correspondingly numbered to the parts and elements of the first amplifying acoustic wave transducer described with reference to FIG. 5 with the prefix 3 replacing the prefix 1 in front of each number.

The operation of this acoustic wave transducer is dependent upon the resistivity of semiconductor body 313 at the regions underlying electrodes 317 and 318 being less than 1.0 ohm-cm, and preferably between 0.05 and 0.001 ohm-cm to provide at least a plane of conductivity underlying said electrodes. This resistivity is provided in the present embodiment by impurity regions 321 and 322; however, said resistivity may be provided by an appropriate impurity concentration extending throughout the semiconductor body. The operation of this amplifying acoustic wave transducer is described by reference to U.S. Pat. No. 3,828,283, granted Nov. 13, 1974 and assigned to the same assignee as the present application.

While the preferred embodiments of the invention have been shown and described with particularity, it is distinctly understood that the invention may be otherwise variously embodied and performed within the scope of the following claims:

What is claimed is:

1. An electrostatically bonded ferroelectric-on-semiconductor field-effect transistor comprising:
   A. a ferroelectric body of a bulk material having opposed first and second major surfaces with at least said first major surface of planar configuration, and having ferroelectric properties;
   B. a semiconductor body of a bulk material and given conductivity type and having opposed first and second major surfaces with at least said first major surface of planar configuration, said first major surface being electrostatically bonded to said first major surface of said body;
   C. at least one electrode, such as a gate electrode, ferroelectric substrate to provide for interaction between transport carriers in the semiconductor body and electrical polarization changes in the ferroelectric body;
   D. source and drain impurity regions of conductivity type opposite to said semiconductor body, said impurity regions spaced apart in said semiconductor body adjoining said first major surface; and
   E. source and drain electrodes positioned on said first major surface of the semiconductor body to make ohmic contact with said source and drain impurity regions, respectively, spaced apart from each other with said ferroelectric body positioned at least therebetween.

2. An electrostatically bonded ferroelectric-on-semiconductor field-effect transistor as set forth in claim 1 wherein;
   said semiconductor body is of a resistivity between 0.01 and 150 ohm-cm.

3. an electrostatically bonded ferroelectric-on-semiconductor field-effect transistor as set forth in claim 2 wherein:
   said semiconductor body is silicon.

4. An amplifying surface wave transducer comprising:
   A. a piezoelectric body of bulk material, having opposed first and second major surfaces with at least said first major surface or planar configuration, and having piezoelectric properties;
   B. a semiconductor body of a bulk material of substantially uniform thickness between about 1 and 50 microns and given conductivity type and having opposed first and second major surfaces with at least said first major surface of planar configuration, said first major surface being electrostatically bonded to said first major surface of said piezoelectric body;
   C. at least first and second electrodes spaced apart from each other on said first major surface of said piezoelectric body with the semiconductor body electrostatically bonded to said first major surface therebetween, said first being a grid with interdigitated fingers adapted to receive an electrical signal and generate acoustic surface waves along said major surface of the piezoelectric body responsive to said electrical signal, and said second electrode being a grid of interdigitated fingers adapted to receive an acoustic surface wave transmitted along said major surface of the piezoelectric body from said first electrode and produce an electrical output signal responsive to said acoustic surface wave; and D. two field electrodes positioned on said second major surface of said semiconductor body substantially parallel to each other along and astride the direction of travel of surface waves between said first and second electrodes to form an amplifying acoustic surface wave transducer.

5. An amplifying surface wave transducer comprising:

A. a piezoelectric body of a bulk material of a substantailly uniform thickness between about 1 and 5 microns, having opposed first and second major surfaces with at least said first major surface of planar configuration, and having piezoelectric properties;

B. a semiconductor body of a bulk material and given conductivity type and having opposed first and second major surfaces with at least said first major surface of planar configuration, said first major surface being electrostatically bonded to said first major surface of said piezoelectric body;

C. at least first and second electrodes spaced apart from each other on said second major surface of the piezoelectric body, with said semiconductor body electrostatically bonded to said opposed first major surface of said piezoelectric body, said first electrode being a grid with interdigitated fingers adapted to receive an electrical signal and generate acoustic surface waves along said major surface of the piezoelectric body responsive to said electrical signal, and said second electrode being a grid with interdigitated fingers adapted to receive an acoustic surface wave transmitted along said major surface of the piezoelectric body from said first electrode and produce an electrical output signal responsive to said acoustic surface wave; and D. the resistivity of said semiconductor body at least in portions adjoining said first major surface opposite said first and second electrode positioned on said second major surface of the piezoelectric body being less than 1.0 ohm-cm to provide at least a plane of conductivity in the semiconductor body adjacent said first major surface opposite said electrodes.

6. An amplifying surface wave transducer as set forth in claim 5 wherein:

said resistivity is provided by impurity regions formed in the semiconductor body of between about 0.05 and 0.001 ohm-cm.

7. An acoustic surface wave convolver:

A. a piezoelectric body of a bulk material, having opposed first and second major surfaces with at least said first major surface of planar configuration, and having piezoelectric properties;

B. a semiconductor body of a bulk material of substantially uniform thickness between about 1 and 50 microns, and given conductivity type and having opposed first and second major surfaces with at least said first major surface of planar configuration, said first major surface being electrostatically bonded to said first major surface of said piezoelectric body;

C. at least first and second electrodes spaced apart from each other on said first major surface of the piezoelectric body with the semiconductor body electrostatically bonded to said first major surface therebetween, said first electrode being a grid with interdigitated fingers adapted to receive an electrical signal and generate acoustic surface waves along said major surface of the piezoelectric body responsive to said electrical signal, and said second electrode being a grid if interdigitated fingers adapted to receive an acoustic surface wave transmitted along said major surface of the piezoelectric body from said first electrode and produce an electrical output signal responsive to said acoustic surface wave;

D. an output electrode on said second major surface of said semiconductor body between said first and second electrode astride the direction of travel of surface waves between said first and second electrodes to form an acoustic surface wave convolver.

* * * * *